US010134485B2

(12) United States Patent
Kim

(10) Patent No.: US 10,134,485 B2
(45) Date of Patent: Nov. 20, 2018

(54) SEMICONDUCTOR DEVICES FOR IMPEDANCE CALIBRATION INCLUDING SYSTEMS AND METHODS THEREOF

(71) Applicant: SK hynix Inc., Icheon-si, Gyeonggi-do (KR)

(72) Inventor: Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/597,476

(22) Filed: May 17, 2017

(65) Prior Publication Data

US 2018/0053567 A1 Feb. 22, 2018

(30) Foreign Application Priority Data

Aug. 16, 2016 (KR) .................. 10-2016-0103484

(51) Int. Cl.
| | |
|---|---|
| *G11C 29/50* | (2006.01) |
| *G11C 5/14* | (2006.01) |
| *G11C 7/22* | (2006.01) |
| *G11C 8/10* | (2006.01) |
| *G11C 7/10* | (2006.01) |
| *G11C 29/02* | (2006.01) |
| *G11C 19/00* | (2006.01) |

(52) U.S. Cl.
CPC ........ *G11C 29/50008* (2013.01); *G11C 5/147* (2013.01); *G11C 7/1057* (2013.01); *G11C 7/1084* (2013.01); *G11C 7/222* (2013.01); *G11C 8/10* (2013.01); *G11C 29/022* (2013.01); *G11C 29/025* (2013.01); *G11C 29/028* (2013.01); *G11C 19/00* (2013.01); *G11C 2207/2272* (2013.01)

(58) Field of Classification Search
CPC ... G11C 29/50008; G11C 5/147; G11C 7/222; G11C 8/10
USPC .......................................................... 326/30
See application file for complete search history.

(56) References Cited

U.S. PATENT DOCUMENTS

| | | | | |
|---|---|---|---|---|
| 7,133,324 B2 * | 11/2006 | Park | ..................... | G11C 7/1012 |
| | | | | 365/185.05 |
| 2010/0208534 A1 | 8/2010 | Fujisawa | | |
| 2011/0066798 A1 * | 3/2011 | Kaiwa | ..................... | G11C 7/04 |
| | | | | 711/106 |
| 2012/0056641 A1 * | 3/2012 | Kuroki | ........... | H03K 19/017545 |
| | | | | 326/30 |

(Continued)

FOREIGN PATENT DOCUMENTS

KR 20130031650 A 3/2013

*Primary Examiner* — Dylan C White
(74) *Attorney, Agent, or Firm* — William Park & Associates Ltd.

(57) ABSTRACT

A semiconductor system may be provided. The semiconductor system may include a first semiconductor device, a second semiconductor device, and a third semiconductor device. The first semiconductor device outputs address signals. The first semiconductor device may receive or output data. The second semiconductor device may perform an impedance calibration operation and outputs pull-up codes and pull-down codes generated by the impedance calibration operation. The third semiconductor device may output internal data selected by the address signals as the data or store the data during a write operation or a read operation.

22 Claims, 11 Drawing Sheets

(56) References Cited

U.S. PATENT DOCUMENTS

| | | | | |
|---|---|---|---|---|
| 2012/0119578 A1* | 5/2012 | Kuwahara | G11O 5/063 | |
| | | | 307/43 | |
| 2012/0134439 A1* | 5/2012 | Sato | G11C 7/1057 | |
| | | | 375/295 | |
| 2013/0088257 A1* | 4/2013 | Hara | H03K 19/00315 | |
| | | | 326/30 | |
| 2015/0063041 A1* | 3/2015 | Arai | G11C 7/1057 | |
| | | | 365/189.05 | |
| 2015/0323971 A1* | 11/2015 | Arai | G11C 7/1057 | |
| | | | 713/310 | |
| 2016/0049180 A1* | 2/2016 | Tsukada | G11C 7/1057 | |
| | | | 365/189.05 | |
| 2018/0033470 A1* | 2/2018 | Lee | G11C 7/12 | |

* cited by examiner

FIG. 3

| OPERATION | CS<1> | CMD<1> | CMD<2> | CMD<3> | CMD<4> | CMD<5> |
|---|---|---|---|---|---|---|
| Write | L | H | H | L | L | H |
| Read | L | H | H | L | L | L |
| Mode Register Read | L | H | L | L | L | L |

FIG. 4

| OPERATION | CS<1> | CMD<1> | CMD<2> | CMD<3> | CMD<4> | CMD<5> |
|---|---|---|---|---|---|---|
| Write | L | | | | | |
| | H | H | H | L | L | H |
| Read | L | | | | | |
| | H | H | H | L | L | L |
| Mode Register Read | L | | | | | |
| | H | H | L | L | L | L |

SEMICONDUCTOR DEVICES FOR IMPEDANCE CALIBRATION INCLUDING SYSTEMS AND METHODS THEREOF

CROSS-REFERENCE TO RELATED APPLICATIONS

The present application claims priority under 35 U.S.C. 119(a) to Korean Application No. 10-2016-0103484, filed on Aug. 16, 2016, which is incorporated herein by reference in its entirety.

BACKGROUND

1. Technical Field

Embodiments of the present disclosure may generally relate to semiconductor devices related to the performance of impedance calibration operation semiconductor systems including the semiconductor devices, and methods thereof.

2. Related Art

In recent years, fast semiconductor systems have been increasingly in demand. Accordingly, the timing margins between internal signals used in the semiconductor system have been reduced. A threshold voltage and a turn-on current of NMOS transistors or PMOS transistors included in the semiconductor systems may change depending on process conditions for fabricating the semiconductor systems, and variation of the threshold voltage and the turn-on current of the NMOS transistors or the PMOS transistors may affect a skew of the internal signals used in the semiconductor systems. If the timing margin between the internal signals is reduced due to a variation of the skew, the semiconductor systems may malfunction.

Additionally, as a level swing width of a transmission signal corresponding to an interface signal between semiconductor devices included in the semiconductor systems operating at a high speed is gradually reduced, reflection of the transmission signal due to impedance mismatch of an interface unit may be raised as a serious issue. The impedance mismatch may occur due to variations in process conditions. Thus, the semiconductor systems employ an impedance matching circuit such as an on-die termination (ODT) circuit.

Impedance calibration (ZQ calibration) means generation of codes for adjusting a resistance value of the ODT circuit, which varies according to a process condition. The ODT circuit whose resistance value is adjusted by the impedance calibration may remove the impedance mismatch of the interface unit to prevent distortion of the transmission signal.

SUMMARY

According to an embodiment, a semiconductor system may be provided. The semiconductor system may include a first semiconductor device, a second semiconductor device, and a third semiconductor device. The first semiconductor device outputs address signals. The first semiconductor device may receive or output data. The second semiconductor device may perform an impedance calibration operation and outputs pull-up codes and pull-down codes generated by the impedance calibration operation. The third semiconductor device may output internal data selected by the address signals as the data or store the data during a write operation or a read operation.

According to an embodiment, a semiconductor device may be provided. The semiconductor device may perform an impedance calibration operation if a combination of command signals is a predetermined combination, outputs pull-up codes and pull-down codes which are generated by the impedance calibration operation. The semiconductor device may drive and output data based on internal data of a memory cell or drive the internal data based on the data, according to the combination of the command signals during a write operation or a read operation. Drivability of the internal data and the data may be adjusted by the pull-up codes and the pull-down codes outputted from an external device.

According to an embodiment, a semiconductor system may be provided. The semiconductor system may include a first semiconductor device, a second semiconductor device, and a third semiconductor device. The first semiconductor device configured to output address signals and configured to receive or output data. The second semiconductor device configured to perform an impedance calibration operation and to output pull-up codes and pull-down codes generated by the impedance calibration operation. The third semiconductor device configured to output internal data selected by the address signals as the data during a read operation or configured to store the data selected by the address signals as the internal data during a write operation, wherein drivability of the internal data and the data is adjusted by the pull-up codes and the pull-down codes. Wherein whether the second semiconductor device performs the impedance calibration and the third semiconductor device performs the write operation is based on chip selection signals and command signals received from the first semiconductor device.

According to an embodiment, a method of operating a semiconductor system may be provided. The method may include using a first semiconductor device to output address signals and to receive and output data. The method may include using a second semiconductor device to perform an impedance calibration operation and to output pull-up codes and pull-down codes generated by the impedance calibration operation. The method may include using a third semiconductor device to output internal data selected by the address signals as the data during a read operation or configured to store the data selected by the address signals as the internal data during a write operation. The method may include adjusting the drivability of the internal data and the data by the pull-up codes and the pull-down codes. Wherein whether the second semiconductor device performs the impedance calibration and the third semiconductor device performs the write operation is based on chip selection signals and command signals received from the first semiconductor device.

BRIEF DESCRIPTION OF THE DRAWINGS

FIG. 3 and FIG. 4 are tables illustrating representations of examples of operations of the second semiconductor device illustrated in FIG. 2 which are performed in accordance with various combinations of a command signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
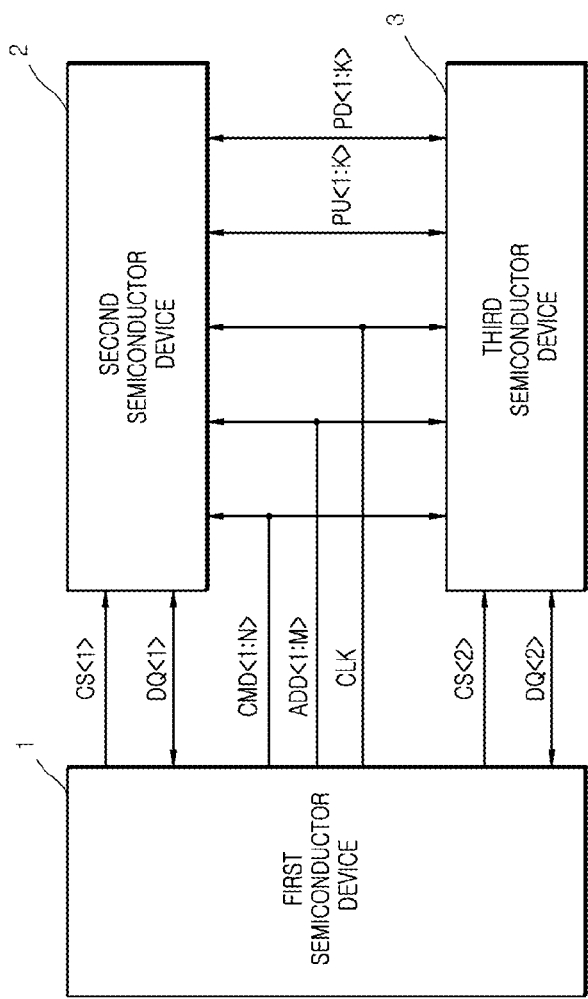
FIG. 1 is a block diagram illustrating a representation of an example of a configuration of a semiconductor system according to an embodiment of the present disclosure.

Referring to FIG. 1, a semiconductor system according to an embodiment of the present disclosure may include a first semiconductor device 1, a second semiconductor device 2, and a third semiconductor device 3.

The first semiconductor device 1 may output chip selection signals CS<1:2>, command signals CMD<1:N>, address signals ADD<1:M>, and a clock signal CLK. The first semiconductor device 1 may receive or output data DQ<1:2>. The first semiconductor device 1 may output the command signals CMD<1:N> having a predetermined combination for performing an impedance calibration operation. The first semiconductor device 1 may output the command signals CMD<1:N> having another predetermined combination for performing a write operation or a read operation. The first semiconductor device 1 may output the clock signal CLK which is toggled during the impedance calibration operation, the write operation, and the read operation. The first semiconductor device 1 may output the data DQ<1:2> and the address signals ADD<1:M> during the write operation. The first semiconductor device 1 may output the address signals ADD<1:M> and may receive the data DQ<1:2> during the read operation. The number "N" of bits of the command signals CMD<1:N> may be set to be a natural number and may be set to be different according to the embodiments. The number "M" of bits of the address signals ADD<1:M> may be set to be a natural number and may be set to be different according to the embodiments. Although FIG. 1 illustrates an example in which the number of bits of the data DQ<1:2> is two, the number of the bits of the data DQ<1:2> may be set to be different according to the embodiments. The data DQ<1:2> may be set to include a continuous data string. The read operation may include a mode register read operation that outputs set information according to an operation of the semiconductor device.

The second semiconductor device 2 may perform the impedance calibration operation and may output pull-up codes PU<1:K> and pull-down codes PD<1:K> which are generated by the impedance calibration operation, in response to the chip selection signal CS<1>, if a combination of the command signals CMD<1:N> is a predetermined combination. The second semiconductor device 2 may store the data DQ<1> in a memory cell which is selected by the address signals ADD<1:M> as internal data (ID of FIG. 2) during the write operation, according to a combination of the command signals CMD<1:N>. The second semiconductor device 2 may output the internal data (ID of FIG. 2) of the memory cell which is selected by the address signals ADD<1:M> as the data DQ<1> during the read operation, according to a combination of the command signals CMD<1:N>. Drivability of the internal data (ID of FIG. 2) and the data DQ<1> may be controlled by the pull-up codes PU<1:K> and the pull-down codes PD<1:K> which are outputted from the third semiconductor device 3 during the write operation or the read operation.

The second semiconductor device 2 according to an embodiment of the present disclosure may include an on die termination (ODT) circuit (not illustrated) for preventing the data DQ<1> from being distorted. The ODT circuit (not illustrated) may not be activated during an initialization operation.

The third semiconductor device 3 may perform the impedance calibration operation and may output the pull-up codes PU<1:K> and the pull-down codes PD<1:K> which are generated by the impedance calibration operation, in response to the chip selection signal CS<2>, if a combination of the command signals CMD<1:N> is a predetermined combination. The third semiconductor device 3 may store the data DQ<2> in a memory cell which is selected by the address signals ADD<1:M> as internal data (not illustrated) during the write operation, according to a combination of the command signals CMD<1:N>. The third semiconductor device 3 may output the internal data (not illustrated) of a memory cell which is selected by the address signals ADD<1:M> as the data DQ<2> during the read operation, according to the combination of the command signals CMD<1:N>. Drivability of the internal data (not illustrated) and the data DQ<2> may be controlled by the pull-up codes PU<1:K> and the pull-down codes PD<1:K> which are outputted from the second semiconductor device 2 during the write operation or the read operation.

The third semiconductor device 3 according to an embodiment of the present disclosure may include an ODT circuit (not illustrated) for preventing the data DQ<2> from being distorted. The ODT circuit (not illustrated) may not be activated during the initialization operation.

Figure 2:
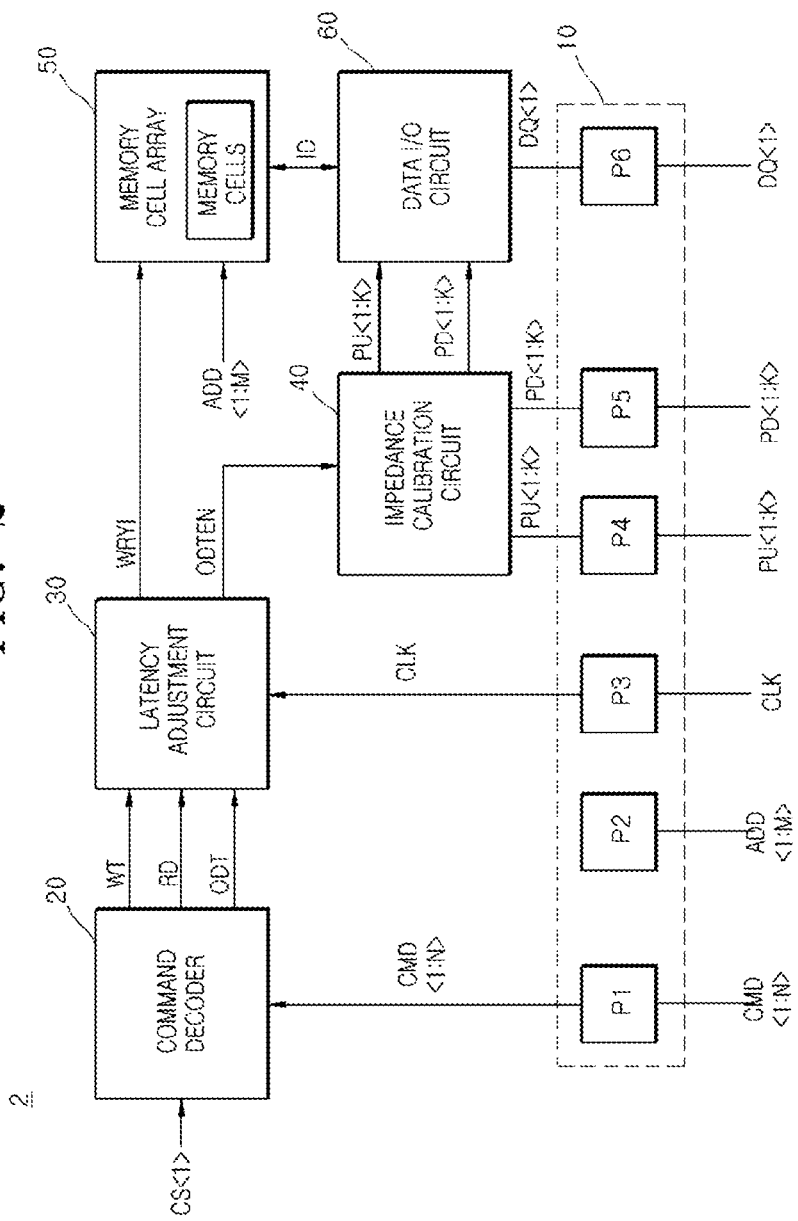
FIG. 2 is a block diagram illustrating a representation of an example of a configuration of a second semiconductor device included in the semiconductor system of FIG. 1.

Referring to FIG. 2, the second semiconductor device 2 according to an embodiment may include a pad portion 10, a command decoder 20, a latency adjustment circuit 30, an impedance calibration circuit 40, a memory cell array 50, and a data input and output (input/output) (I/O) circuit 60.

The pad portion 10 may include a first pad P1, a second pad P2, a third pad P3, a fourth pad P4, a fifth pad P5, and a sixth pad P6. The number of pads included in the pad portion 10 may be set to be different according to the embodiments.

The command decoder 20 may decode the command signals CMD<1:N> which are inputted through the first pad P1 to generate a write command signal WT, a read command signal RD, and an impedance calibration command signal ODT, in response to the chip selection signal CS<1>. The command decoder 20 may generate the write command signal WT and the read command signal RD which are sequentially enabled by the command signals CMD<1:N> that are inputted through the first pad P1 in response to the chip selection signal CS<1>. The command decoder 20 may generate the write command signal WT which is enabled in response to the chip selection signal CS<1>, if the command signals CMD<1:N> inputted through the first pad P1 have a combination for the write operation. The command decoder 20 may generate the read command signal RD which is enabled in response to the chip selection signal CS<1>, if the command signals CMD<1:N> inputted through the first pad P1 have a combination for the read operation. The command decoder 20 may generate the impedance calibration command signal ODT which is enabled in response to the chip selection signal CS<1>, if the command signals CMD<1:N> inputted through the first pad P1 have a predetermined combination.

The latency adjustment circuit 30 may shift the write command signal WT by a first period in which a clock pulse of the clock signal CLK inputted through the third pad P3 is inputted by a first number of times to generate a column selection signal WRYI. The latency adjustment circuit 30 may shift the read command signal RD by the first period in which the clock pulse of the clock signal CLK inputted through the third pad P3 is inputted by the first number of times to generate the column selection signal WRYI. The latency adjustment circuit 30 may shift the impedance calibration command signal ODT by a second period in which the clock pulse of the clock signal CLK inputted through the third pad P3 is inputted by a second number of times to generate an impedance calibration enable signal ODTEN. An operation of generating the column selection signal WRYI by shifting the write command signal WT or the read command signal RD by the first period in the latency adjustment circuit 30 will be described later. An operation of generating the impedance calibration enable signal ODTEN by shifting the impedance calibration command signal ODT by the second period in the latency adjustment circuit 30 will also be described later.

The impedance calibration circuit 40 may output the pull-up codes PU<1:K> and the pull-down codes PD<1:K> which are adjusted by a resistance value of an external resistor (RZQ of FIG. 8) in response to the impedance calibration enable signal ODTEN. The impedance calibration circuit 40 may output the pull-up codes PU<1:K> which is adjusted by the resistance value of the external resistor (RZQ of FIG. 8) through the fourth pad P4 and may output the pull-down codes PD<1:K> which is adjusted by the resistance value of the external resistor (RZQ of FIG. 8) through the fifth pad P5, if the impedance calibration enable signal ODTEN is enabled. The impedance calibration circuit 40 may receive the pull-up codes PU<1:K> through the fourth pad P4 to output the pull-up codes PU<1:K> to the data I/O circuit 60 and may receive the pull-down codes PD<1:K> through the fifth pad P5 to output the pull-down codes PD<1:K> to the data I/O circuit 60, if the impedance calibration enable signal ODTEN is disabled. The impedance calibration circuit 40 may be realized using a general ZQ calibration circuit.

The memory cell array 50 may store the internal data ID in a memory cell which is selected by the address signals ADD<1:M> received from the second pad P2 or may output the internal data ID stored in a memory cell which is selected by the address signals ADD<1:M> received from the second pad P2, in response to the column selection signal WRYI. The memory cell array 50 may store the internal data ID in a memory cell which is selected by the address signals ADD<1:M> received from the second pad P2 in response to the column selection signal WRYI during the write operation. The memory cell array 50 may output the internal data ID of the memory cell which is selected by the address signals ADD<1:M> received from the second pad P2 during the read operation.

The data I/O circuit 60 may drive the data DQ<1> using the drivability which is adjusted by the pull-up codes PU<1:K> and the pull-down codes PD<1:K> in response to the internal data ID or may drive the internal data ID using the drivability which is adjusted in response to the data DQ<1>. The data I/O circuit 60 may drive the internal data ID using the drivability which is adjusted by the pull-up codes PU<1:K> and the pull-down codes PD<1:K> in response to the data DQ<1> which is received from the sixth pad P6 during the write operation. The data I/O circuit 60 may drive the data DQ<1> using the drivability which is adjusted by the pull-up codes PU<1:K> and the pull-down codes PD<1:K> to output the data DQ<1> through the sixth pad P6, in response to the internal data ID during the read operation.

The third semiconductor device 3 according to an embodiment of the present disclosure may be realized to have substantially the same configuration as the second semiconductor device 2 illustrated in FIG. 2 and to perform the same operation as the second semiconductor device 2. Thus, a detailed description of the third semiconductor device 3 will be omitted hereinafter.

Combinations of the command signals CMD<1:N> for performing the impedance calibration (ZQ calibration) in the write operation, the read operation, and the mode register read operation of the second semiconductor device 2 will be described hereinafter with reference to FIG. 3. In the following description, it may be assumed, for example but not limited to, that the number "N" of bits of the command signals CMD<1:N> is five.

The combination of the command signals for performing the impedance calibration (ZQ calibration) in the write operation may be set to be a case in which a level of the chip selection signal CS<1> does not change at a logic low (L) level, a first command signal CMD<1> having a logic high (H) level is inputted, a second command signal CMD<2> having a logic high (H) level is inputted, a third command signal CMD<3> having a logic low (L) level is inputted, a fourth command signal CMD<4> having a logic low (L) level is inputted, and a fifth command signal CMD<5> having a logic high (H) level is inputted.

The combination of the command signals for performing the impedance calibration (ZQ calibration) in the read operation may be set to be a case in which a level of the chip selection signal CS<1> does not change at a logic low (L) level, the first command signal CMD<1> having a logic high (H) level is inputted, the second command signal CMD<2> having a logic high (H) level is inputted, the third command signal CMD<3> having a logic low (L) level is inputted, the fourth command signal CMD<4> having a logic low (L) level is inputted, and the fifth command signal CMD<5> having a logic low (L) level is inputted.

The combination of the command signals for performing the impedance calibration (ZQ calibration) in the mode register read operation may be set to be a case in which a level of the chip selection signal CS<1> does not change at a logic low level L, the first command signal CMD<1> having a logic high (H) level is inputted, the second command signal CMD<2> having a logic low (L) level is inputted, the third command signal CMD<3> having a logic low (L) level is inputted, the fourth command signal CMD<4> having a logic low (L) level is inputted, and the fifth command signal CMD<5> having a logic low (L) level is inputted.

Combinations of the command signals for not performing the impedance calibration (ZQ calibration) in the write operation, the read operation, and the mode register read operation of the second semiconductor device 2 will be described hereinafter with reference to FIG. 4. In the following description, it may be assumed, for example but not limited to, that the number "N" of bits of the command signals CMD<1:N> is five.

The combination of the command signals for preventing execution of the impedance calibration (ZQ calibration) in the write operation may be set to be a case in which a level of the chip selection signal CS<1> changes from a logic low (L) level into a logic high (H) level, the first command signal CMD<1> having a logic high (H) level is inputted, the second command signal CMD<2> having a logic high (H) level is inputted, the third command signal CMD<3> having a logic low (L) level is inputted, the fourth command signal CMD<4> having a logic low (L) level is inputted, and the fifth command signal CMD<5> having a logic high (H) level is inputted.

The combination of the command signals for preventing execution of the impedance calibration (ZQ calibration) in the read operation may be set to be a case in which a level of the chip selection signal CS<1> changes from a logic low (L) level into a logic high (H) level, the first command signal CMD<1> having a logic high (H) level is inputted, the second command signal CMD<2> having a logic high (H) level is inputted, the third command signal CMD<3> having a logic low (L) level is inputted, the fourth command signal CMD<4> having a logic low (L) level is inputted, and the fifth command signal CMD<5> having a logic low (L) level is inputted.

The combination of the command signals for preventing execution of the impedance calibration (ZQ calibration) in the mode register read operation may be set to be a case in which a level of the chip selection signal CS<1> changes from a logic low (L) level into a logic high (H) level, the first command signal CMD<1> having a logic high (H) level is inputted, the second command signal CMD<2> having a logic low (L) level is inputted, the third command signal CMD<3> having a logic low (L) level is inputted, the fourth command signal CMD<4> having a logic low (L) level is inputted, and the fifth command signal CMD<5> having a logic low (L) level is inputted.

Figure 5:
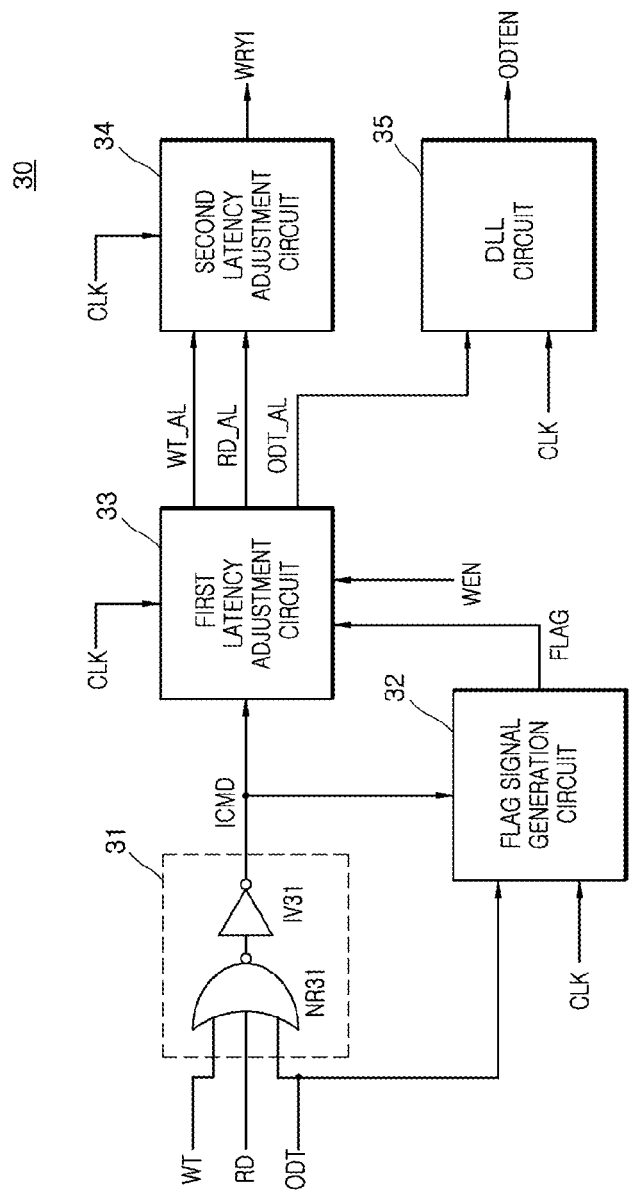
FIG. 5 is a block diagram illustrating a representation of an example of a configuration of a latency adjustment circuit included in the second semiconductor device of FIG. 2.

Referring to FIG. 5, the latency adjustment circuit 30 according to an embodiment of the present disclosure may include an internal command generation circuit 31, a flag signal generation circuit 32, a first latency adjustment circuit 33, a second latency adjustment circuit 34, and a delay locked loop (DLL) circuit 35.

The internal command generation circuit 31 may be realized to include a NOR gate NR31 and an inverter IV31 and may generate an internal command signal ICMD which is enabled if at least one of the write command signal WT, the read command signal RD, and the impedance calibration command signal ODT is inputted. The internal command generation circuit 31 may generate the internal command signal ICMD which is enabled to have a logic high level if at least one of the write command signal WT, the read command signal RD, and the impedance calibration command signal ODT has a logic high level. The internal command generation circuit 31 may perform a logical OR operation of the write command signal WT, the read command signal RD, and the impedance calibration command signal ODT to generate the internal command signal ICMD.

The flag signal generation circuit 32 may generate a flag signal FLAG from the impedance calibration command signal ODT in synchronization with the clock signal CLK in response to the internal command signal ICMD. The flag signal generation circuit 32 may latch the impedance calibration command signal ODT at a point of time that the internal command signal ICMD is generated in synchronization with the clock signal CLK and may output the latched impedance calibration command signal ODT as the flag signal FLAG.

The first latency adjustment circuit 33 may shift the internal command signal ICMD by a second period to generate a first latency signal WT_AL, a second latency signal RD_AL, and a third latency signal ODT_AL, in response to the flag signal FLAG and a write enable signal WEN. The second period may be set to be an additive latency (AL) corresponding to the number of cycle times of the clock signal CLK inputted during a row address signal (RAS) to column address signal (CAS) delay time (tRCD). The second period may set to be different according to the embodiments. The write enable signal WEN may be set to be a signal which is enabled to have a logic high level during the write operation.

The second latency adjustment circuit 34 may shift the first latency signal WT_AL or the second latency signal RD_AL by a third period to generate the column selection signal WRYI. The third period may be set to be a column address strobe latency (CL) to correspond to the number of cycle times of the clock signal CLK inputted to guarantee data alignment time after a column address signal is inputted. The third period may be set to be different according to the embodiments. The first period may be set to correspond to a sum of the second period and the third period.

The DLL circuit 35 may match a phase of the clock signal CLK with a phase of the third latency signal ODT_AL to output the impedance calibration enable signal ODTEN. The DLL circuit 35 may be realized using a general delay locked loop (DLL) circuit.

Figure 6:
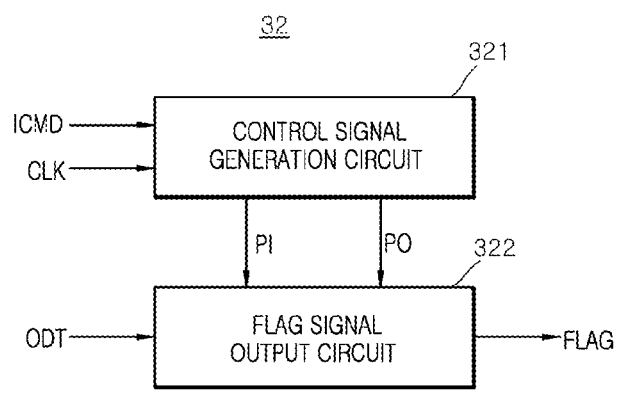
FIG. 6 is a block diagram illustrating a representation of an example of a configuration of a flag signal generation circuit included in the latency adjustment circuit of FIG. 5.

Referring to FIG. 6, the flag signal generation circuit 32 according to an embodiment of the present disclosure may include a control signal generation circuit 321 and a flag signal output circuit 322.

The control signal generation circuit 321 may generate an input control signal PI which is enabled at a point of time that the internal command signal ICMD is inputted in synchronization with the clock signal CLK and may also generate an output control signal PO which is enabled if a clock pulse of the clock signal CLK is inputted by a predetermined number of times from the point of time that the internal command signal ICMD is inputted. Here, the predetermined number of times of the clock pulse of the clock signal CLK inputted from a point of time that the internal command signal ICMD is inputted may be less than the additive latency (AL) by a single cycle time of the clock signal CLK.

The flag signal output circuit 322 may latch the impedance calibration command signal ODT in response to the input control signal PI and may output the latched impedance calibration command signal ODT as the flag signal FLAG in response to the output control signal PO.

Figure 7:
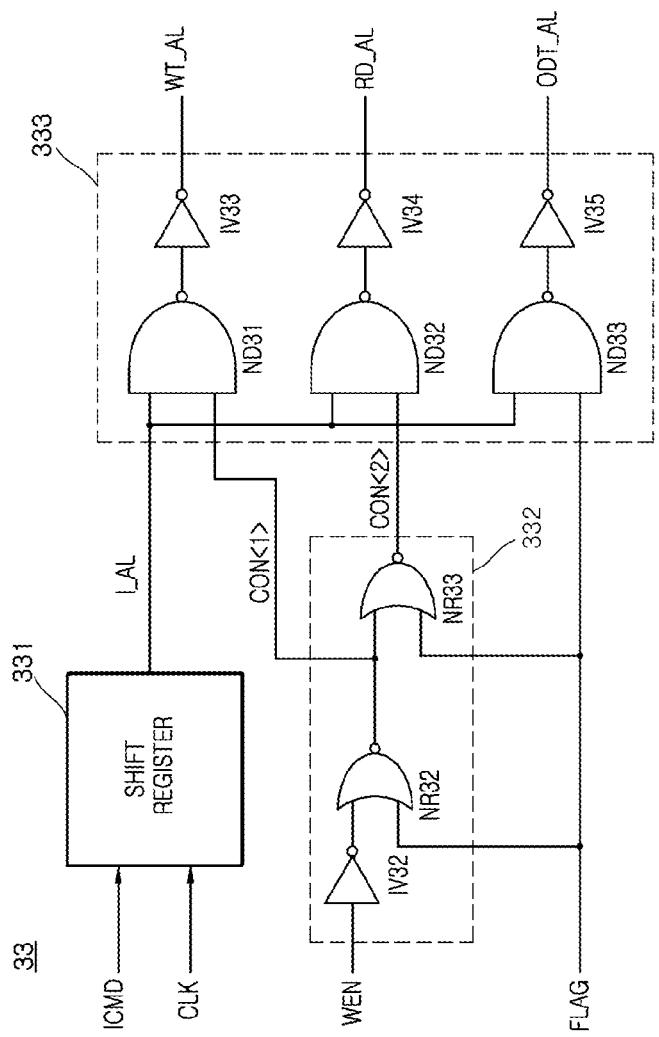
FIG. 7 illustrates a representation of an example of a configuration of a first latency adjustment circuit included in the latency adjustment circuit of FIG. 5.

Referring to FIG. 7, the first latency adjustment circuit 33 according to an embodiment of the present disclosure may include a shift register 331, a first logic circuit 332, and a second logic circuit 333.

The shift register 331 may shift the internal command signal ICMD by the second period to generate an internal latency signal I_AL. That is, the shift register 331 may shift the internal command signal ICMD by the additive latency (AL) to generate the internal latency signal I_AL.

The first logic circuit 332 may be realized to include an inverter IV32 and NOR gates NR32 and NR33 and may be configured to generate a first control signal CON<1> and a second control signal CON<2>, one of which is selectively enabled in response to the flag signal FLAG and the write enable signal WEN. The first logic circuit 332 may generate the first control signal CON<1> which is enabled to have a logic high level, if the flag signal FLAG is disabled to have a logic low level and the write enable signal WEN is enabled to have a logic high level. The first logic circuit 332 may generate the second control signal CON<2> which is enabled to have a logic high level, if the flag signal FLAG is disabled to have a logic low level and the write enable signal WEN is disabled to have a logic low level.

The second logic circuit 333 may be realized to include NAND gates ND31, ND32, and ND33, and inverters IV33, IV34, and IV35. The second logic circuit 333 may be configured to output the internal latency signal I_AL as the first latency signal WT_AL, the second latency signal RD_AL, or the third latency signal ODT_AL in response to the first control signal CON<1>, the second control signal CON<2>, and the flag signal FLAG. The second logic circuit 333 may output the internal latency signal I_AL as the first latency signal WT_AL if the first control signal CON<1> is enabled to have a logic high level. The second logic circuit 333 may output the internal latency signal I_AL as the second latency signal RD_AL if the second control signal CON<2> is enabled to have a logic high level. The second logic circuit 333 may output the internal latency signal I_AL as the third latency signal ODT_AL if the flag signal FLAG is enabled to have a logic high level.

Figure 8:
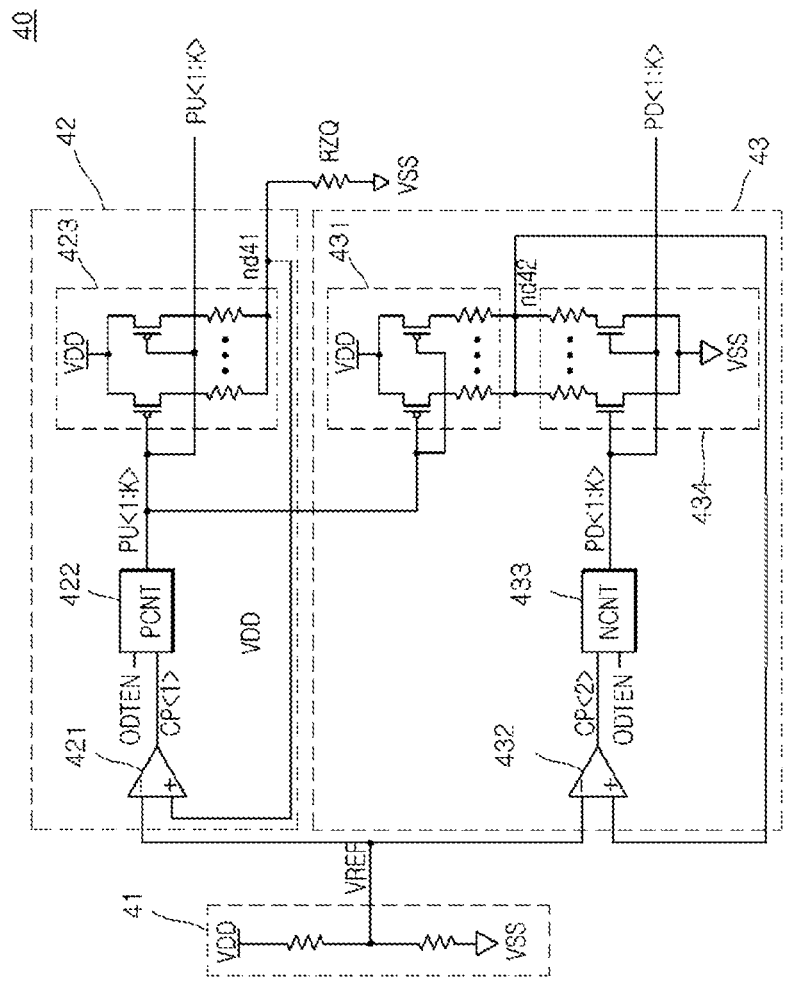
FIG. 8 illustrates a representation of an example of a configuration of an impedance calibration circuit included in the second semiconductor device of FIG. 2.

Referring to FIG. 8, the impedance calibration circuit 40 according to an embodiment of the present disclosure may include a reference voltage generation circuit 41, a pull-up code generation circuit 42, and a pull-down code generation circuit 43.

The reference voltage generation circuit 41 may divide a power supply voltage VDD using resistors which are connected in series between a power supply voltage VDD terminal and a ground voltage VSS terminal to generate a reference voltage VREF having a constant level. The number of the resistors included in the reference voltage generation circuit 41 may be set to be different according to the embodiments. The reference voltage generation circuit 41 may be realized using a general voltage generation circuit for generating the reference voltage VREF having a constant level.

The pull-up code generation circuit 42 may compare a voltage of a node nd41 connected to the external resistor RZQ with the reference voltage VREF to generate the pull-up codes PU<1:K>, if the impedance calibration enable signal ODTEN is enabled. The pull-up code generation circuit 42 may output the pull-up codes PU<1:K> to the data I/O circuit 60 if the impedance calibration enable signal ODTEN is disabled.

For example, the pull-up code generation circuit 42 may include a first comparator 421, a first counter 422 (PCNT), and a first pull-up drive circuit 423.

The first comparator 421 may compare the voltage of the node nd41 with the reference voltage VREF to generate a first comparison signal CP<1>. The first comparison signal CP<1> may be set to be enabled if the voltage of the node nd41 is lower than the reference voltage VREF. The first comparator 421 may generate the first comparison signal CP<1> having a logic high level if the voltage of the node nd41 is higher than the reference voltage VREF and may generate the first comparison signal CP<1> having a logic low level if the voltage of the node nd41 is lower than the reference voltage VREF. A logic level of the first comparison signal CP<1> generated according to the comparison results of the voltage of the node nd41 and the reference voltage VREF may be set to be different according to the embodiments.

The first counter 422 may output the pull-up codes PU<1:K> that are counted in response to the first comparison signal CP<1> having a logic low level. The first counter 422 may output the pull-up codes PU<1:K> that are counted up or down in response to the first comparison signal CP<1>.

The first pull-up drive circuit 423 may pull up the voltage of the node nd41 to a level of the power supply voltage VDD in response to the pull-up codes PU<1:K>.

The pull-down code generation circuit 43 may drive a node nd42 using drivability which is adjusted by the pull-up codes PU<1:K> and may compare a voltage of the node nd42 with the reference voltage VREF to generate the pull-down codes PD<1:K>, if the impedance calibration enable signal ODTEN is enabled. The pull-down code generation circuit 43 may output the pull-down codes PD<1:K> to the data I/O circuit 60 if the impedance calibration enable signal ODTEN is disabled.

For example, the pull-down code generation circuit 43 may include a second pull-up drive circuit 431, a second comparator 432, a second counter 433 (NCNT), and a pull-down drive circuit 434.

The second pull-up drive circuit 431 may pull up a voltage of the node nd42 to the level of the power supply voltage VDD in response to the pull-up codes PU<1:K>.

The second comparator 432 may compare the voltage of the node nd42 with the reference voltage VREF to generate a second comparison signal CP<2>. The second comparison signal CP<2> may be set to be enabled if the voltage of the node nd42 is higher than the reference voltage VREF. The second comparator 432 may generate the second comparison signal CP<2> having a logic high level if the voltage of the node nd42 is higher than the reference voltage VREF and may generate the second comparison signal CP<2> having a logic low level if the voltage of the node nd42 is lower than the reference voltage VREF. A logic level of the second comparison signal CP<2> generated according to the comparison results of the voltage of the node nd42 and the reference voltage VREF may be set to be different according to the embodiments.

The second counter 433 may output the pull-down codes PD<1:K> that are counted in response to the second comparison signal CP<2> having a logic high level. The second counter 433 may output the pull-down codes PD<1:K> that are counted up or down according to a logic level of the second comparison signal CP<2>.

The pull-down drive circuit 434 may pull down the voltage of the node nd42 to a level of the ground voltage VSS in response to the pull-down codes PD<1:K>.

Figure 9:
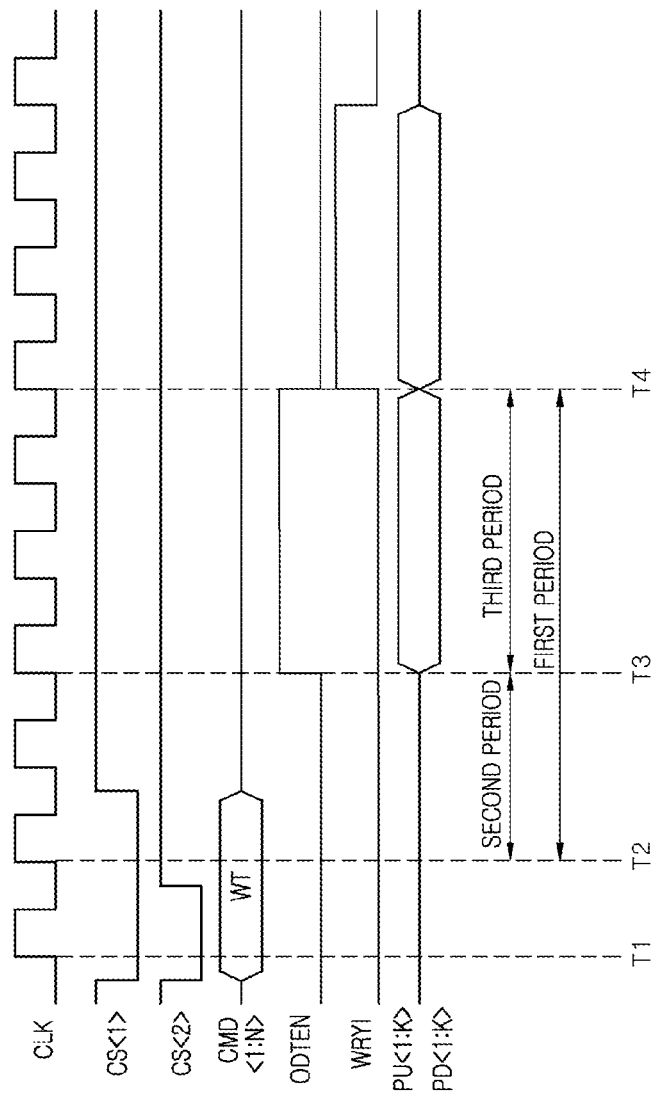
FIG. 9 is a timing diagram illustrating a representation of an example of an operation of a semiconductor system according to an embodiment of the present disclosure.

An operation of the semiconductor system according to an embodiment of the present disclosure will be described with reference to FIG. 9 in conjunction with an example in which the second semiconductor device 2 performs the impedance calibration operation during the write operation.

At a point of time T1, the first semiconductor device 1 may output the chip selection signals CS<1:2>, the command signals CMD<1:N>, the address signals ADD<1:M>, and the clock signal CLK. For example, the chip selection signal CS<1> may have a logic low level L, the chip selection signal CS<2> may have a logic low level L, the first command signal CMD<1> may have a logic high level H, the second command signal CMD<2> may have a logic high level H, the third command signal CMD<3> may have a logic low level L, the fourth command signal CMD<4> may have a logic low level L, and the fifth command signal CMD<5> may have a logic high level H.

At a point of time T2, the first semiconductor device 1 may output the chip selection signals CS<1:2>, the command signals CMD<1:N>, the address signals ADD<1:M>, and the clock signal CLK. For example, the chip selection signal CS<1> may have a logic low level L, the chip selection signal CS<2> may have a logic high level H, the first command signal CMD<1> may have a logic high level H, the second command signal CMD<2> may have a logic high level H, the third command signal CMD<3> may have a logic low level L, the fourth command signal CMD<4> may have a logic low level L, and the fifth command signal CMD<5> may have a logic high level H (see also FIG. 3).

Since a level of the chip selection signal CS<1> does not change at a logic low level at the point of time T2, the command decoder 20 of the second semiconductor device 2 may decode the command signals CMD<1:N> inputted through the first pad P1 to generate the impedance calibration command signal ODT having a logic high level.

Since a level of the chip selection signal CS<2> changes from a logic low level into a logic high level, a command decoder (not illustrated) of the third semiconductor device 3 may decode the command signals CMD<1:N> to generate the write command signal WT having a logic high level.

At a point of time T3, the latency adjustment circuit 30 of the second semiconductor device 2 may shift the impedance calibration command signal ODT by the second period in which a clock pulse of the clock signal CLK is inputted through the third pad P3 by a second number of times from the point of time T2, thereby generating the impedance calibration enable signal ODTEN. The second period may be set to be the additive latency (AL) corresponding to the number of cycle times of the clock signal CLK inputted during a RAS to CAS delay time (tRCD).

The impedance calibration circuit 40 of the second semiconductor device 2 may output the pull-up codes PU<1:K> and the pull-down codes PD<1:K> which are adjusted by the resistance value of the external resistor RZQ in response to the impedance calibration enable signal ODTEN.

At a point of time T4, a latency adjustment circuit (not illustrated) of the third semiconductor device 3 may shift the write command signal WT by the first period in which a clock pulse of the clock signal CLK is inputted through the third pad P3 by the second number of times to generate the column selection signal WRYI. The latency adjustment circuit (not illustrated) may generate the impedance calibration enable signal ODTEN which is enabled to have a logic low level. Here, a period from the point of time T3 till the point of time T4 is set to be the third period. The third period may correspond to a column address strobe latency (CL).

The impedance calibration circuit 40 (not illustrated) of the third semiconductor device 3 may receive the pull-up codes PU<1:K> and the pull-down codes PD<1:K> to output the pull-up codes PU<1:K> and the pull-down codes PD<1:K> to a data output circuit (not illustrated) of the third semiconductor device 3 in response to the impedance calibration enable signal ODTEN which is disabled to have a logic low level.

A memory array (not illustrated) of the third semiconductor device 3 may output internal data (not illustrated) stored in memory cells which are selected by the address signals ADD<1:M> in response to the column selection signal WRYI.

A data I/O circuit (not illustrated) of the third semiconductor device 3 drives the internal data with drivability which is adjusted by the pull-up codes PU<1:K> and the pull-down codes PD<1:K>, in response to the data DQ<2>.

A memory cell array (not illustrated) of the third semiconductor device 3 may store internal data (not illustrated) in memory cells which are selected by the address signals ADD<1:M> in response to the column selection signal WRYI.

As described above, according to a semiconductor system having an aforementioned configuration, a first semiconductor device may perform the impedance calibration operation in response to the command signals and may output the pull-up codes and the pull-down codes which are generated by the impedance calibration operation, and a second semiconductor device may adjust drivability of data in response to the pull-up codes and the pull-down codes outputted from the first semiconductor device during the write operation or the read operation. Accordingly, the number of external pins of the semiconductor device for performing the impedance calibration operation may be reduced.

Figure 10:
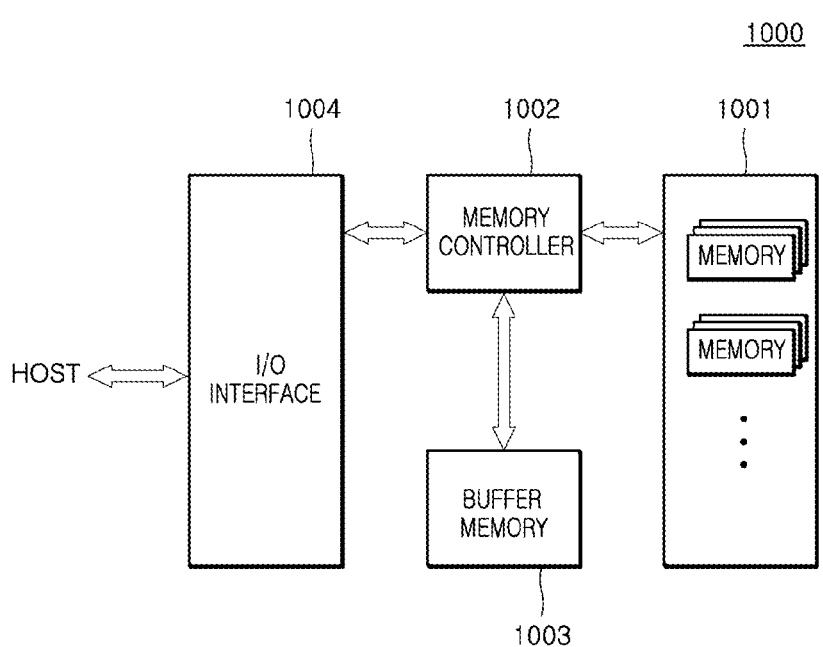
FIG. 10 is a block diagram illustrating a representation of an example of a configuration of an electronic system employing the semiconductor device or the semiconductor system illustrated in FIGS. 1 to 9.

The semiconductor device or the semiconductor system described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor device 2 and the third semiconductor device 3 illustrated in FIG. 1. The data storage circuit 1001 may generate internal data having a logic level which is internally set regardless of data inputted from an external device and may perform an initialization operation of storing the internal data in a memory cell array. The data storage circuit 1001 may include an ODT circuit (not illustrated) for preventing distortion of data. The ODT circuit may be designed not to operate during the initialization operation of the data storage circuit 1001. In addition, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 11:
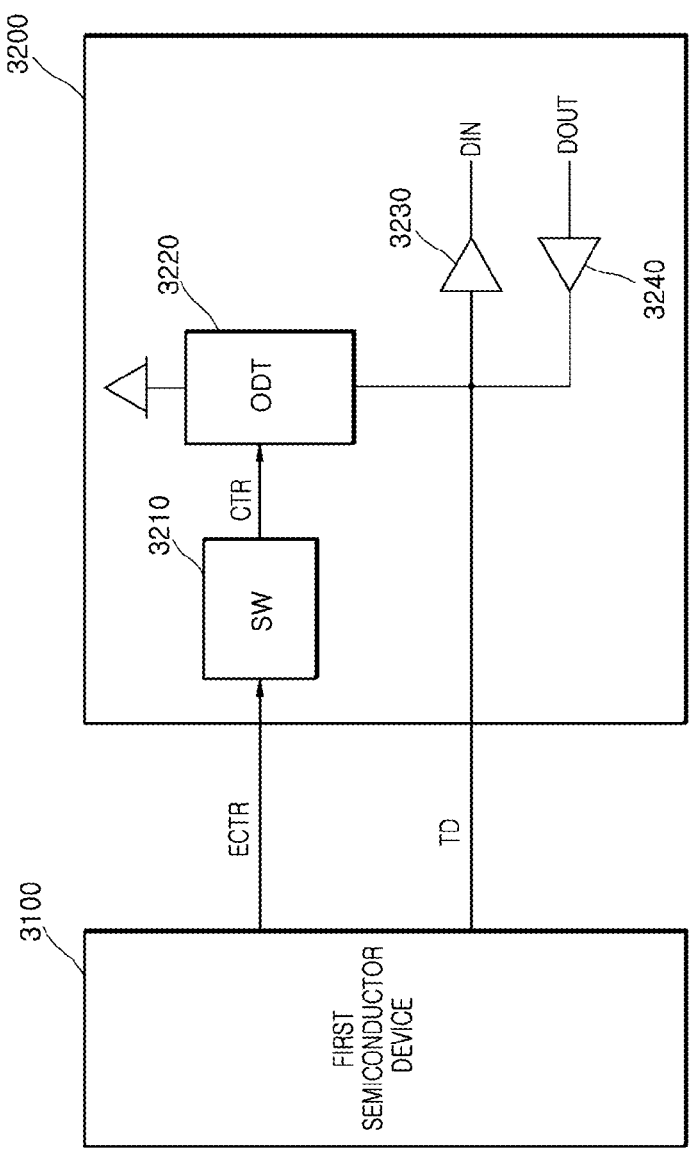
FIG. 11 is a block diagram illustrating a representation of an example of a configuration of another electronic system employing the semiconductor device or the semiconductor system illustrated in FIGS. 1 to 9.

The semiconductor devices or the semiconductor systems described with reference to FIGS. 1 to 9 may be applied to an electronic system that includes a memory system, a graphic system, a computing system, a mobile system, or the like. For example, as illustrated in FIG. 11, an electronic system 3000 according an embodiment may include a first semiconductor device 3100 and a second semiconductor device 3200.

The first semiconductor device 3100 may apply an external control signal ECTR for controlling an ODT circuit 3220 included in the second semiconductor device 3200 to the second semiconductor device 3200. The first semiconductor device 3100 may not apply the external control signal ECTR to the second semiconductor device 3200 during an initialization operation of the second semiconductor device 3200. The first semiconductor device 3100 may apply transmission data TD to the second semiconductor device 3200.

The second semiconductor device 3200 may include a switch (SW) 3210, the ODT circuit 3220, an input buffer 3230 and an output buffer 3240. The switch (SW) 3210 may receive the external control signal ECTR and may output the external control signal ECTR as a control signal CTR. The ODT circuit 3220 may be turned on in response to the control signal CTR. The ODT circuit 3220 may be turned off during the initialization operation of the second semiconductor device 3200. The input buffer 3230 may receive the transmission data TD to generate input data DIN during a write operation. The input data DIN may store in memory cells (not illustrated) included in the second semiconductor device 3200 during the write operation. The output buffer 3240 may receive output data DOUT and may output the output data DOUT as the transmission data TD, during a read operation. The output data DOUT may be outputted from the memory cells (not illustrated) included in the second semiconductor device 3200 during the read operation.

What is claimed is:

1. A semiconductor system comprising:
a first semiconductor device configured to output chip selection signals, command signals, address signals and a clock signal and configured to receive or output data;
a second semiconductor device configured to perform an impedance calibration operation and to output pull-up codes and pull-down codes generated by the impedance calibration operation, based on the chip selection signals and a combination of the command signals; and
a third semiconductor device configured to output internal data of a memory cell selected by the address signals as the data or configured to store the data in the memory cell selected by the address signals as the internal data, according to the command signals based on the chip selection signals and the command signals during a write operation or a read operation,
wherein drivability of the internal data and the data is adjusted by the pull-up codes and the pull-down codes, and
wherein the second semiconductor device includes:
a command decoder configured to decode the command signals to generate a write command signal, a read command signal, and an impedance calibration command signal, based on the chip selection signals; and
a latency adjustment circuit configured to shift the write command signal and the read command signal by a first period in which a clock pulse of the clock signal is inputted by a first number of times to generate a column selection signal and configured to shift the impedance calibration command signal by a second period in which a clock pulse of the clock signal is inputted by a second number of times to generate an impedance calibration enable signal.

2. The system of claim 1,
wherein the third semiconductor device is configured to perform the impedance calibration operation and to output the pull-up codes and the pull-down codes generated by the impedance calibration operation,
wherein the second semiconductor device is configured to output the internal data selected by the address signals as the data during the read operation or is configured to store the data selected by the address signals as the internal data during the write operation,
wherein when the second semiconductor device performs the impedance calibration operation, the third semiconductor device performs the write operation or the read operation, and wherein when the second semiconductor device performs the write operation or the read operation, the third semiconductor device performs the impedance calibration operation.

3. The system of claim 1, wherein the second semiconductor device further includes:
an impedance calibration circuit configured to output the pull-up codes and the pull-down codes which are adjusted by a resistance value of an external resistor if the impedance calibration enable signal is enabled.

4. The system of claim 3, wherein the latency adjustment circuit includes:
an internal command generation circuit configured to generate an internal command signal which is enabled if at least one of the write command signal, the read command signal, and the impedance calibration command signal is inputted;
a flag signal generation circuit configured to latch the impedance calibration command signal and configured to output the latched impedance calibration command signal as a flag signal, in synchronization with the clock signal based on the internal command signal;
a first latency adjustment circuit configured to shift the internal command signal by the second period to generate a first latency signal, a second latency signal, and a third latency signal, based on the flag signal and a write enable signal;
a second latency adjustment circuit configured to shift the first latency signal and the second latency signal by a third period in which a clock pulse of the clock signal is inputted by a third number of times to generate the column selection signal; and
a delay locked loop (DLL) circuit configured to match a phase of the clock signal with a phase of the third latency signal to output the impedance calibration enable signal.

5. The system of claim 4,
wherein the first period is set to be a sum of the second period and the third period,
wherein the second period is set to be an additive latency, and
wherein the third period is set to be a column address signal (CAS) latency.

6. The system of claim 4, wherein the flag signal generation circuit includes:
a control signal generation circuit configured to generate an input control signal which is enabled at a point of time that the internal command signal is inputted in synchronization with the clock signal and to generate an output control signal which is enabled if a clock pulse of the clock signal is inputted by a predetermined number of times from a point of time that the internal command signal is inputted; and
a flag signal output circuit configured to latch the impedance calibration command signal based on the input control signal and configured to output the latched impedance calibration command signal as the flag signal based on the output control signal.

7. The system of claim 6, wherein the predetermined number of times is less than the number of the clock pulses of the clock signal inputted during the second period by at least one.

8. The system of claim 4, wherein the first latency adjustment circuit includes:
a shift register configured to shift the internal command signal by the second period to generate an internal latency signal;
a first logic circuit configured to generate a first control signal and a second control signal, one of which is selectively enabled based on the flag signal and the write enable signal; and
a second logic circuit configured to output the internal latency signal as the first latency signal if the first control signal is enabled, configured to output the internal latency signal as the second latency signal if the second control signal is enabled, and configured to output the internal latency signal as the third latency signal if the flag signal is enabled.

9. The system of claim 3, wherein the impedance calibration circuit includes:
a reference voltage generation circuit configured to divide a power supply voltage to generate a reference voltage;
a pull-up code generation circuit configured to compare a voltage of a first node which is connected to the external resistor with the reference voltage to generate the pull-up codes, if the impedance calibration enable signal is enabled; and
a pull-down code generation circuit configured to drive a second node with drivability which is adjusted by the pull-up codes and configured to compare a voltage of the second node with the reference voltage to generate the pull-down codes, if the impedance calibration enable signal is enabled.

10. The system of claim 9,
wherein the pull-up code generation circuit receives the pull-up codes to drive the first node, if the impedance calibration enable signal is disabled, and
wherein the pull-down code generation circuit receives the pull-down codes to drive the second node, if the impedance calibration enable signal is disabled.

11. The system of claim 3, wherein the second semiconductor device further includes:
a memory cell array configured to store internal data in a memory cell which is selected by the address signals or configured to output the stored internal data, based on the column selection signal; and
a data input and output (I/O) circuit configured to drive the data with drivability which is adjusted by the pull-up codes and the pull-down codes based on the internal data or configured to drive the internal data with the adjusted drivability based on the data.

12. The system of claim 11, wherein the second semiconductor device further comprises:
a pad portion comprising:
a first pad configured to receive the command signals and provide the command signals to the command decoder;
a second pad configured to receive the address signals and provide the address signals to the memory cell array;
a third pad configured to receive the clock signal and provide the clock signal to the latency adjustment circuit;
a fourth pad configured to receive the pull-up codes and provide the pull-up codes to the impedance calibration circuit;
a fifth pad configured to receive the pull-down codes and provide the pull-down codes to the impedance calibration circuit; and
a sixth pad configured to receive the data and provide the data to the data input and output circuit.

13. The system of claim 1, wherein the third semiconductor device includes:

a command decoder configured to decode the command signals to generate a write command signal, a read command signal, and an impedance calibration command signal, based on the chip selection signals;

a latency adjustment circuit configured to shift the write command signal and the read command signal by a first period in which a clock pulse of the clock signal is inputted by a first number of times to generate a column selection signal and configured to shift the impedance calibration command signal by a second period in which the clock pulse of the clock signal is inputted by a second number of times to generate an impedance calibration enable signal;

an impedance calibration circuit configured to receive the pull-up codes and the pull-down codes to output the pull-up codes and the pull-down codes to a data I/O circuit, if the impedance calibration enable signal is disabled;

a memory cell array configured to store internal data in a memory cell which is selected by the address signals or configured to output the stored internal data, based on the column selection signal; and the data I/O circuit configured to drive the data with drivability which is adjusted by the pull-up codes and the pull-down codes based on the internal data or configured to drive the internal data with the adjusted drivability based on the data.

14. A semiconductor device configured to perform an impedance calibration operation if a combination of command signals is a predetermined combination, configured to output pull-up codes and pull-down codes which are generated by the impedance calibration operation, and configured to drive and output data based on internal data of a memory cell or to drive the internal data based on the data according to the combination of the command signals during a write operation or a read operation, wherein drivability of the internal data and the data is adjusted by the pull-up codes and the pull-down codes received externally from the semiconductor device, and wherein the semiconductor device includes:

a command decoder configured to decode the command signals to generate a write command signal, a read command signal, and an impedance calibration command signal, based on chip selection signals;

a latency adjustment circuit configured to shift the write command signal and the read command signal by a first period in which a clock pulse of a clock signal is inputted by a first number of times to generate a column selection signal and configured to shift the impedance calibration command signal by a second period in which the clock pulse of the clock signal is inputted by a second number of times to generate an impedance calibration enable signal.

15. The device of claim 14, wherein the semiconductor device further includes:

an impedance calibration circuit configured to output the pull-up codes and the pull-down codes which are adjusted by a resistance value of an external resistor to an external device or to output the pull-up codes and the pull-down codes to a data input/output (I/O) circuit, based on the impedance calibration enable signal;

a memory cell array configured to store internal data in a memory cell which is selected by the address signals or to output the stored internal data, based on the column selection signal; and the data input and output (I/O) circuit configured to drive the data with drivability which is adjusted by the pull-up codes and the pull-down codes based on the internal data or configured to drive the internal data with the adjusted drivability based on the data.

16. The device of claim 15, the semiconductor device further comprises:

a pad portion comprising:

a first pad configured to receive the command signals and provide the command signals to the command decoder;

a second pad configured to receive the address signals and provide the address signals to the memory cell array;

a third pad configured to receive the clock signal and provide the clock signal to the latency adjustment circuit;

a fourth pad configured to receive the pull-up codes and provide the pull-up codes to the impedance calibration circuit;

a fifth pad configured to receive the pull-down codes and provide the pull-down codes to the impedance calibration circuit; and a sixth pad configured to receive the data and provide the data to the data input and output circuit.

17. The device of claim 15, wherein the latency adjustment circuit includes:

an internal command generation circuit configured to generate an internal command signal which is enabled if at least one of the write command signal, the read command signal, and the impedance calibration command signal is inputted;

a flag signal generation circuit configured to latch the impedance calibration command signal and configured to output the latched impedance calibration command signal as a flag signal, in synchronization with the clock signal based on the internal command signal;

a first latency adjustment circuit configured to shift the internal command signal by the second period to generate a first latency signal, a second latency signal, and a third latency signal, based on the flag signal and a write enable signal;

a second latency adjustment circuit configured to shift the first latency signal and the second latency signal by a third period in which the clock pulse of the clock signal is inputted by a third number of times to generate the column selection signal; and a delay locked loop (DLL) circuit configured to match a phase of the clock signal with a phase of the third latency signal to output the impedance calibration enable signal.

18. The device of claim 17, wherein the first period is set to be a sum of the second period and the third period, wherein the second period is set to be an additive latency, and wherein the third period is set to be a column address signal (CAS) latency.

19. The device of claim 17, wherein the flag signal generation circuit includes:

a control signal generation circuit configured to generate an input control signal which is enabled at a point of time that the internal command signal is inputted in synchronization with the clock signal and configured to generate an output control signal which is enabled if a clock pulse of the clock signal is inputted by a predetermined number of times from a point of time that the internal command signal is inputted; and a flag signal output circuit configured to latch the impedance calibration command signal based on the input control signal and configured to output the latched impedance calibration command signal as the flag signal based on the output control signal.

20. The device of claim 19, wherein the predetermined number of times is less than the number of the clock pulses of the clock signal inputted during the second period by at least one.

21. The device of claim 17, wherein the first latency adjustment circuit includes:
   a shift register configured to shift the internal command signal by the second period to generate an internal latency signal;
   a first logic circuit configured to generate a first control signal and a second control signal, one of which is selectively enabled based on the flag signal and the write enable signal; and
   a second logic circuit configured to output the internal latency signal as the first latency signal if the first control signal is enabled, configured to output the internal latency signal as the second latency signal if the second control signal is enabled, and configured to output the internal latency signal as the third latency signal if the flag signal is enabled.

22. The device of claim 15, wherein the impedance calibration circuit includes:
   a reference voltage generation circuit configured to divide a power supply voltage to generate a reference voltage;
   a pull-up code generation circuit configured to compare a voltage of a first node which is connected to the external resistor with the reference voltage to generate the pull-up codes if the impedance calibration enable signal is enabled and configured to receive the pull-up codes to drive the first node if the impedance calibration enable signal is disabled; and
   a pull-down code generation circuit configured to drive a second node with drivability which is adjusted by the pull-up codes and to compare a voltage of the second node with the reference voltage to generate the pull-down codes if the impedance calibration enable signal is enabled and configured to receive the pull-down codes to drive the second node if the impedance calibration enable signal is disabled.

* * * * *